United States Patent
Ohashi et al.

[11] Patent Number: 5,904,769
[45] Date of Patent: May 18, 1999

[54] EPITAXIAL GROWTH METHOD

[75] Inventors: Tadashi Ohashi, Sagamihara; Shinichi Mitani, Numazu; Takaaki Honda, Mishima, all of Japan

[73] Assignees: Toshiba Ceramics Co., Ltd.; Toshiba Machine Co., Ltd., both of Tokyo, Japan

[21] Appl. No.: 08/775,353

[22] Filed: Jan. 3, 1997

[30] Foreign Application Priority Data

Jan. 12, 1996 [JP] Japan ............................ 8-004284

[51] Int. Cl.$^6$ .................................................. C30B 25/14
[52] U.S. Cl. ............................ 117/89; 117/91; 117/98; 117/102; 117/105; 427/248.1; 427/255.1; 427/255.2
[58] Field of Search ........................ 117/84, 95, 102, 117/105, 89, 91, 98; 427/248.1, 255.2; 477/255.1

[56] References Cited

U.S. PATENT DOCUMENTS 5,096,534  3/1992  Ozias ........................... 117/102
5,198,071  3/1993  Scudder et al. ............... 117/84

FOREIGN PATENT DOCUMENTS 0 092 435 A1  10/1983  European Pat. Off.
2185445  4/1974  France .
1002899  of 0000  United Kingdom .

OTHER PUBLICATIONS

Growth of Silicon on Si (100) via Hydrogen/Chlorine Exchange and the Effect of of Interfacial Boron; Koleske, D;D; Gates, S.M; Beach, D.B; J. Appl. Phys. (1992), 72(9). pp. 4073–4082, 1992.

Regolini, J.L. and Bensahel, D., "Epitaxial Silicon Chemical Vapor Deposition Below Atmospheric Pressure", *Materials Science & Engineering*, 4(1):407–415, 1989.

Sato, Y. and Ohmine, T., "Wafer Rotation Effect on Silicon Epitaxial Growth", *International Conference on Solid State Devices and Materials*, Yokohama, Japan, pp. 717–718, 1991.

*Primary Examiner*—Felisa Hiteshew
*Attorney, Agent, or Firm*—Christensen O'Connor Johnson & Kindness PLLC

[57] ABSTRACT

This invention provides an epitaxial growth method capable of decreasing variations of the resistance of an epitaxial layer resulting from an in-plane temperature distribution of a silicon wafer and also capable of reducing particles and haze. This epitaxial growth method is an epitaxial growth method of growing a boron- or phosphorus-doped silicon epitaxial layer on the surface of a silicon wafer with an in-plane temperature distribution of 2 to 50° C., and includes the steps of arranging the silicon wafer in a reaction vessel, supplying into the reaction vessel a source gas containing (a) silane, (b) 5 to 600 vol % of hydrogen chloride added to the silane, and (c) a dopant consisting of a boron compound or a phosphorus compound, and growing a boron- or phosphorus-doped silicon epitaxial layer on the surface of the wafer by setting a vacuum degree of 10 to 200 torr in the reaction vessel and heating the wafer to 900 to 1100° C.

11 Claims, 3 Drawing Sheets

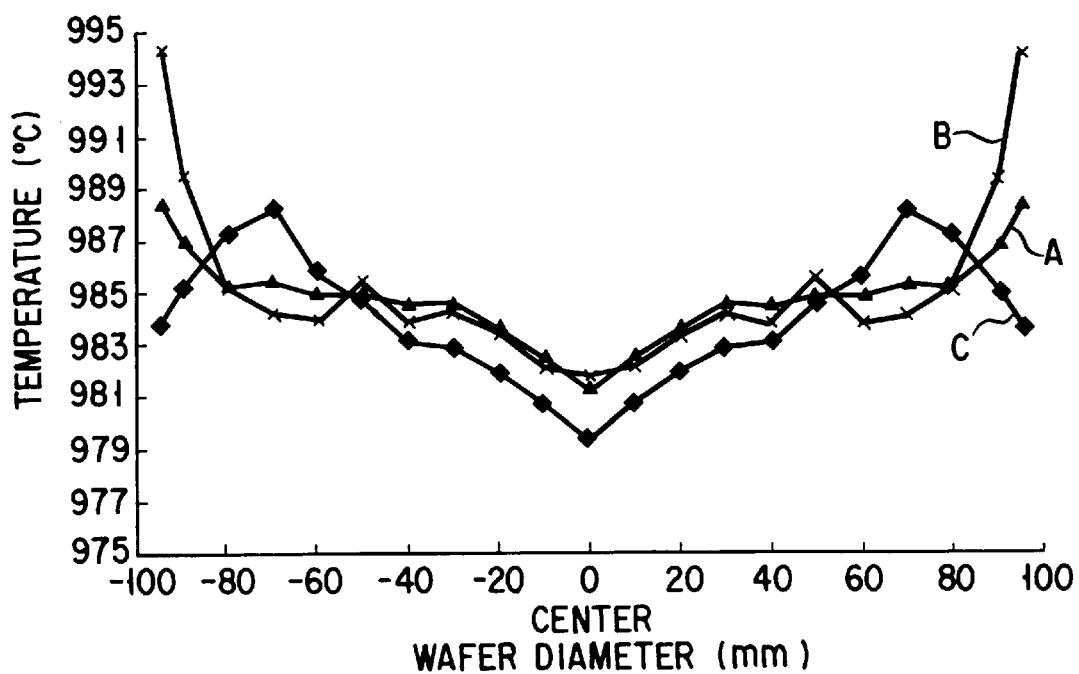
F I G. 5
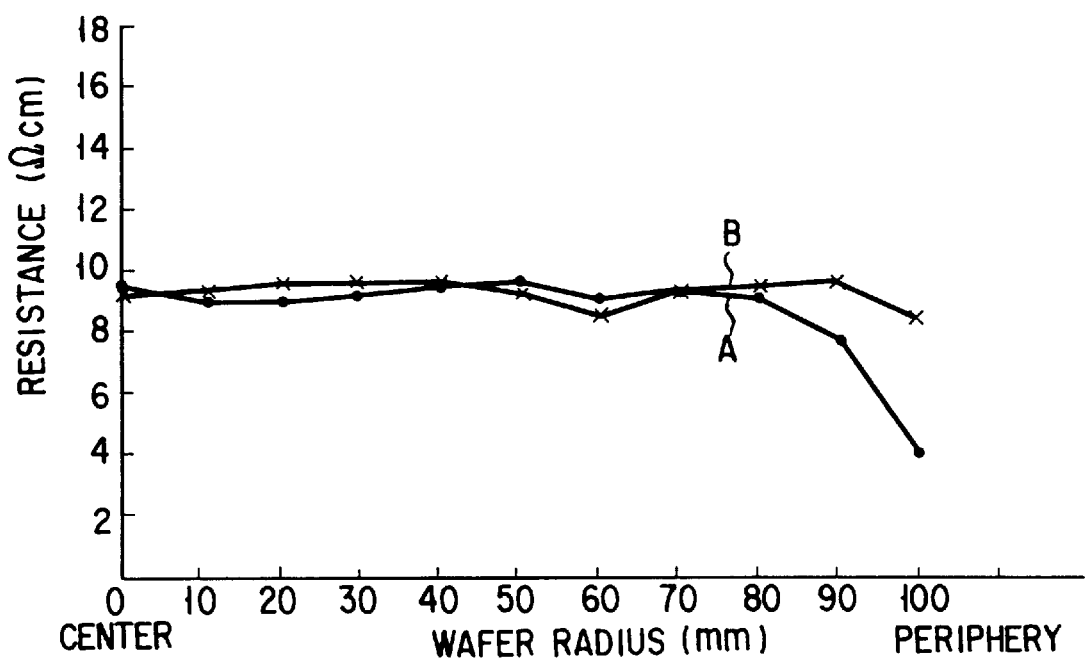
F I G. 6

EPITAXIAL GROWTH METHOD

BACKGROUND OF THE INVENTION

The present invention relates to an epitaxial growth method.

Generally, an epitaxial wafer is manufactured by the following method. First, a silicon wafer is placed in a reaction vessel. While the wafer is heated with the interior of the reaction vessel held at a predetermined vacuum degree, a source gas containing a silicon source (e.g., $SiH_4$ or $SiHCl_3$) and a dopant such as a boron compound (e.g., diborane; $B_2H_6$) is supplied. By this supply of the source gas, silane and $B_2H_6$ are thermally decomposed on the surface of the heated water, manufacturing an epitaxial wafer on which a boron-doped silicon epitaxial layer is grown. In particular, $SiH_4$ as the silicon source has the characteristic that the temperature dependence of the growth rate of silicon is small in the temperature range of 950 to 1050° C.

When the wafer is heated during the epitaxial growth, a temperature distribution is formed in the plane of the wafer. For example, a rotatable ring-like support member is arranged in a reaction vessel, a silicon wafer is sheet-fed to this support member and horizontally arranged on it, and the wafer is heated from its back side. This method brings about problems that (1) heat is radiated from the peripheral portion of the wafer through the support member and (2) a defect such as a slip occurs on the wafer in contact with the support member. Accordingly, the temperature of the support member is increased, i.e., so-called offset heating is performed to avoid these problems (1) and (2). This offset heating gives a wafer an in-plane temperature distribution in which the temperature is high in the peripheral portion and low in the central portion as indicated by characteristic curves A and B in FIG. 5. Note that the characteristic curve A was obtained when the offset temperature was set at 20° C. and the characteristic curve B was obtained when the offset temperature was set at 35° C. A characteristic curve C was obtained when the offset temperature was 0° C.

As described above, a silicon wafer is horizontally arranged on a rotatable ring-like support member in a reaction vessel, and the wafer is heated to 900 to 1100° C. while the interior of the reaction vessel is held at a predetermined vacuum degree. When a source gas containing $SiH_4$ and $B_2H_6$ is supplied from the upper portion of the reaction vessel toward the wafer while the wafer is rotated by the support member, $B_2H_6$ as a dopant increases the amount (doping amount) of boron to be doped into the epitaxial layer as the temperature rises. Consequently, the boron doping amount increases in the peripheral portion of the wafer where the temperature is high and decreases in the central portion of the wafer. Note that when a phosphorus compound (e.g., phosphine; $PH_3$) as an n-type impurity is used, the doping amount to be doped into the epitaxial layer similarly increases with a temperature rise. As a result, an epitaxial layer is grown in which the resistance of the peripheral portion is low in the plane of the wafer as indicated by characteristic curves A and B in FIG. 6. Note that the characteristic curve A was obtained when the offset temperature was set at 20° C. and the characteristic curve B was obtained when the offset temperature was set at 30° C.

As described above, the method using a source gas containing $SiH_4$ and $B_2H_6$ as a dopant can form an epitaxial layer having a comparatively uniform thickness in the plane of the wafer. However, the method also has the problem that the resistance varies in the plane of the wafer due to the distribution of the dopant amount.

Note that the temperature distribution in the plane of the wafer cannot be avoided not only in the method using the offset heating described above but also in a method in which the entire back surface of the wafer is evenly held.

To avoid this variation of the resistance in the plane of the wafer, it is possible to control the flow rate of the source gas to be supplied into the reaction vessel. As an example, a silicon wafer is horizontally arranged on a support member in a reaction vessel and heated to 900 to 1100° C. The amount of a source gas containing $SiH_4$ and $B_2H_6$ to be supplied toward the wafer from the upper portion of the reaction vessel while the wafer is rotated at a fixed velocity by the support member is decreased. In this method, the supply amount of the source gas increases in the peripheral portion of the wafer, and this makes the growth rate (deposition rate) of silicon in the peripheral portion of the wafer higher than that in the central portion of the wafer. Therefore, the increase of the doping amount in the peripheral portion of the wafer caused by the in-plane temperature distribution (the temperature is high in the peripheral portion of the wafer and low in its central portion) can be canceled by increasing the growth rate of silicon in the peripheral portion of the wafer. As a consequence, the variation of the resistance in the plane of the wafer can be decreased. However, when the growth rate (deposition rate) of silicon in the peripheral portion of the wafer is made higher than that in the central portion of the wafer, the thickness of the epitaxial layer in the plane of the wafer increases in the peripheral portion of the wafer, posing a new problem of a nonuniform thickness.

BRIEF SUMMARY OF THE INVENTION

It is an object of the present invention to provide an epitaxial growth method capable of decreasing variations of the resistance of an epitaxial layer resulting from an in-plane temperature distribution of a silicon wafer and also capable of reducing particles and haze.

According to the present invention, there is provided an epitaxial growth method of growing a boron- or phosphorus-doped silicon epitaxial layer on a surface of a silicon wafer with an in-plane temperature distribution of 2 to 50° C., comprising the steps of:

arranging the silicon wafer in a reaction vessel;

supplying into the reaction vessel a source gas containing (a) silane, (b) 5 to 600 vol % of hydrogen chloride added to the silane, and (c) a dopant consisting of a boron compound or a phosphorus compound; and growing a boron- or phosphorus-doped silicon epitaxial layer on a surface of the wafer by setting a vacuum degree of 10 to 200 torr in the reaction vessel and heating the wafer to 900 to 1100° C.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a graph showing the in-plane temperature distribution of a wafer when the wafer was offset-heated; and FIG. 6 is a graph showing a resistance distribution when a boron-doped silicon epitaxial layer was grown on the surface of an offset-heated wafer.

DETAILED DESCRIPTION OF THE INVENTION

Figure 1:
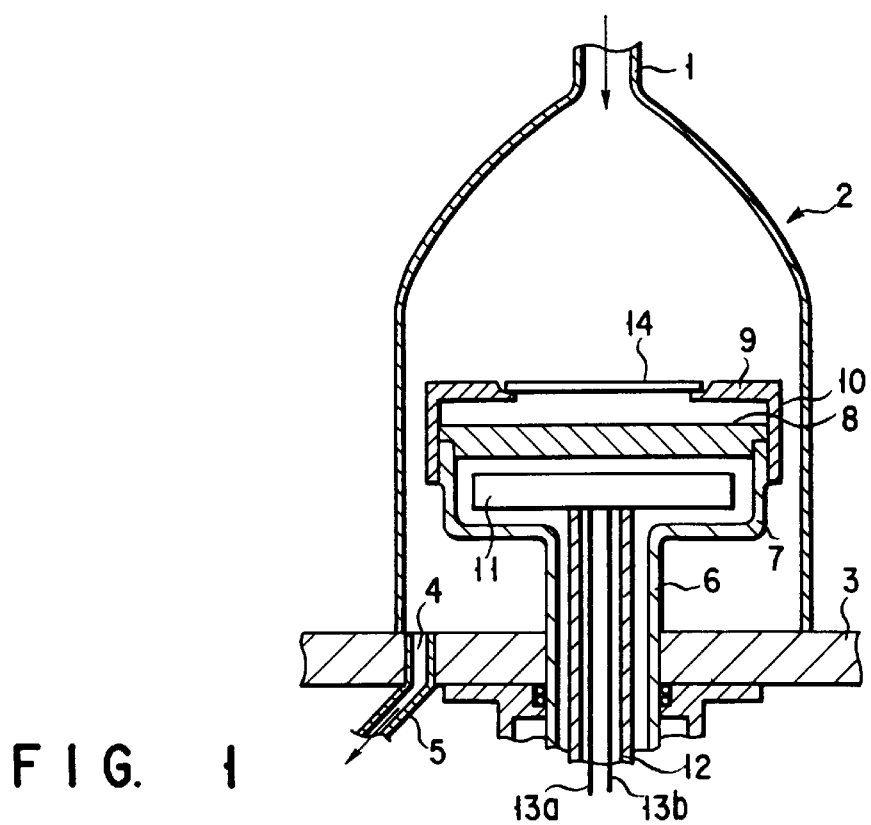
FIG. 1 is a sectional view showing an epitaxial growth apparatus used in an epitaxial growth method of the present invention.

An epitaxial growth method according to the present invention will be described below with reference to an epitaxial growth apparatus shown in FIG. 1.

A reaction vessel 2 having a gas inlet 1 in the upper portion and an open bottom portion is arranged on a base plate 3. An exhaust port 4 is open in a portion of the base plate 3 near the inner surface of the reaction vessel 2. An exhaust pipe 5 is connected to the exhaust port 4 of the base plate 3, and the other end of the pipe 5 is connected to a vacuum pump (not shown). A cylindrical support shaft 6 is rotatably supported through the base plate 3 so that the shaft 6 is in the center of the reaction vessel 2. A closed-end cylinder support member 7 is formed integrally with the cylindrical support shaft 6 by increasing the diameter of the upper end of the shaft 6. A disk-like cover 8 is attached to the upper end of the closed-end cylinder support member 7. A cylinder 10 to the upper surface of which an annular support piece 9 is integrally formed is fitted on the upper circumferential surface of the cylindrical support member 7 so that the annular support piece 9 is separated a predetermined distance from the cover 8. A disk-like heater 11 is arranged in the space surrounded by the closed-end cylinder support member 7 and the cover 8 and is supported by a cylinder 12 inserted through the cylindrical support shaft 6. Lead wires 13a and 13b are connected to the heater 11 through the cylinder 12.

The epitaxial growth method according to the present invention will be described below by using the above epitaxial growth apparatus shown in FIG. 1.

A silicon wafer 14 is sheet-fed onto the annular support piece 9 in the reaction vessel 2. The vacuum pump (not shown) is activated to exhaust a gas in the chamber surrounded by the reaction vessel 2 and the base plate 3 through the exhaust port 4 and the exhaust pipe 5, thereby setting a predetermined vacuum degree. Subsequently, the wafer 14 positioned above the disk-like heater 11 is heated to 900 to 1100° C. by heating the heater 11. More specifically, the wafer 14 placed on the annular support piece 9 is offset-heated by the support piece 9. Consequently, radiation of heat from the annular support piece 9 prevents cooling of the peripheral portion of the wafer 14, and this also suppresses a defect such as a slip on the wafer 14. This offset heating gives the wafer 14 an in-plane temperature distribution of 2 to 50° C.

Subsequently, while the vacuum pump keeps exhausting and the cylindrical support shaft 6 is rotated at a desired speed, a source gas is supplied toward the surface of the wafer 14 from the gas inlet 1 of the reaction vessel 2, the vacuum degree is set to 10 to 200 torr, and the wafer 14 is heated to 900 to 1100° C. so that the in-plane temperature distribution of the wafer is 2 to 50° C. By the supply of the source gas and the heating as described above, a boron- or phosphorus-doped silicon epitaxial layer is grown on the surface of the wafer.

The source gas has a composition containing (a) silane, (b) 5 to 600 vol % of hydrogen chloride (HCl) added to the silane, and (c) a dopant consisting of a boron compound or a phosphorus compound.

An example of the boron compound contained as a dopant in the source gas is diborane ($B_2H_6$). The addition amount of the boron compound is preferably $4\times10^{-9}$ to $2\times10^{-6}$ times the amount of the silane as a volume ratio.

An example of the phosphorus compound contained as a dopant in the source gas is phosphine ($PH_3$). The addition amount of the phosphorus compound is preferably $4\times10^{-9}$ to $2\times10^{-6}$ times the amount of the silane as a volume ratio.

The HCl amount in the source gas is defined for the reasons explained below. If the addition amount of HCl is less than 5 vol %, it becomes difficult to achieve the effect of increasing the growth rate of silicon toward the high-temperature region during epitaxial growth. If the addition amount of HCl exceeds 600 vol %, the etching effect of HCl on silicon becomes too strong and this makes the growth of a silicon epitaxial layer on the surface of a wafer difficult. The HCl addition amount with respect to silane is more preferably 50 to 300 vol %, and most preferably 100 to 300 vol %.

The source gas can be supplied to the reaction vessel by using hydrogen as a carrier gas. When a hydrogen carrier gas is contained in the source gas, it is possible to prevent the thermal decomposition of silane in the gas phase in the reaction vessel and thereby prevent particles from being formed by silicon formed by the thermal decomposition of silane. The addition amount of hydrogen is preferably 130 to 300 times the amount of silane as a volume ratio. If the addition amount of hydrogen is less than 130 times the amount of silane as a volume ratio, it becomes difficult to achieve a satisfactory effect of preventing the thermal decomposition of silane in the gas phase. If the addition amount of hydrogen exceeds 300 times the amount of silane as a volume ratio, the silane amount becomes too small and it is possible that the epitaxial growth rate decreases.

The vacuum degree in the reaction vessel is defined for the reasons explained below. If the vacuum degree in the reaction vessel is less than 10 torr, the source gas concentration decreases and it is probable that the epitaxial growth rate decreases. If the vacuum degree in the reaction vessel exceeds 200 torr, the thermal decomposition of silane in the gas phase readily occurs to decrease the silane amount supplied to the wafer surface, and the epitaxial growth rate is likely to decrease. The vacuum degree in the reaction vessel is more preferably 30 to 100 torr.

The temperature of the wafer is defined for the reasons explained below. If the wafer temperature is lower than 900° C., there is the possibility that surface roughness (haze) takes place on the epitaxial layer. If the wafer temperature exceeds 1100° C., the amount of particles (Si or SimHn)

formed by a side reaction increases and there is the possibility of the quality of the epitaxial layer degrading.

In the epitaxial growth, it is possible by rotating the silicon wafer to prevent the thickness of the epitaxial layer from becoming nonuniform due to the source gas flowing toward the wafer surface. This rotating speed of the wafer is preferably 500 to 2500 rpm.

In the epitaxial growth method according to the present invention described above, the silicon wafer 14 is arranged on the annular support piece 9 as a heated support member in the reaction vessel 2. While the wafer is being offset-heated by the annular support piece 9, a source gas containing (a) silane, (b) 5 to 600 vol % of hydrogen chloride (HCl) added to the silane, and (c) a dopant consisting of a boron compound or a phosphorus compound is supplied to the reaction vessel 2. The vacuum degree is set to 10 to 200 torr, and the wafer is heated to 900 to 1100° C. When epitaxial growth is done by the above method, the growth rate of silicon can be increased in the high-temperature region within the heating temperature range described above. That is, when epitaxial growth is performed it is possible to control the silicon growth rate by the addition amount of HCl to the source in addition to the heating temperature of the silicon wafer and the supply amount of the source gas.

More specifically, by using the epitaxial growth apparatus shown in FIG. 1, the source gas was supplied from the gas inlet 1 of the reaction vessel 2 toward the silicon wafer 14 rotating at a rate of 2000 rpm such that the supply amount of $SiH_4$ was 0.3 l/min, the supply amount of hydrogen (a carrier gas) was 50 l/min, and the supply amount of hydrogen gas containing 0.1 ppm of diborane ($B_2H_6$) was 0.01 l/min. In this state epitaxial growth was performed by setting the vacuum degree in the reaction vessel to 50 torr. During the epitaxial growth, the growth rate of silicon was checked while the addition amount of HCl in the source gas and the heating temperature of the wafer were changed. The results are shown in FIG. 2.

Figure 2:
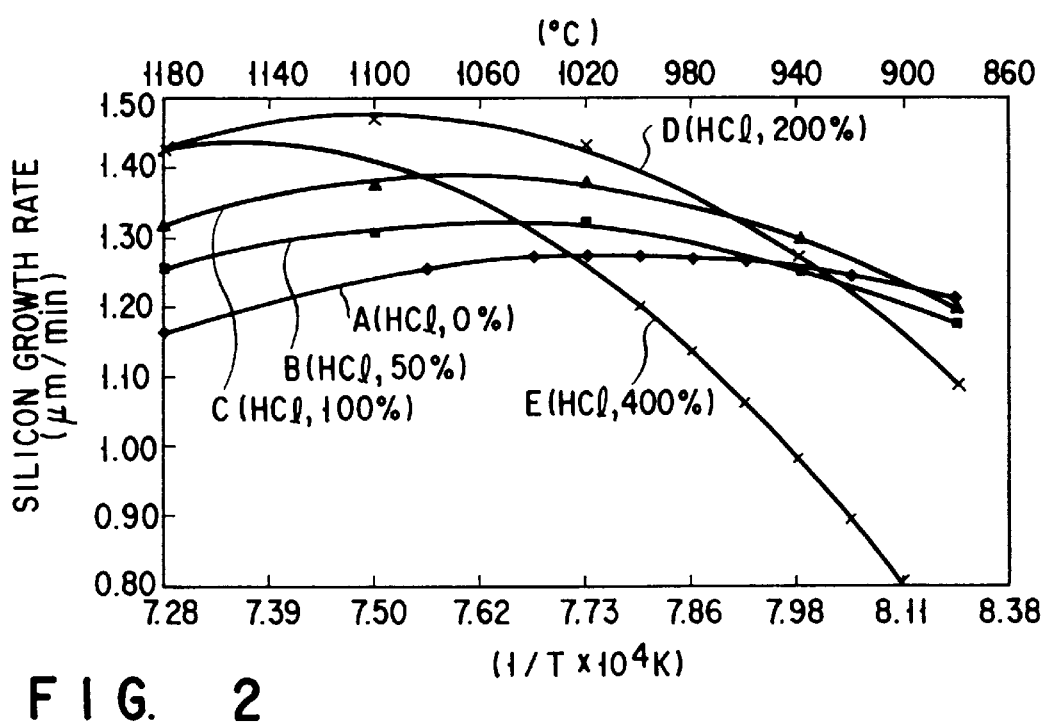
FIG. 2 is a graph showing the relationship between the temperature and the silicon growth rate when epitaxial growth was performed by using source gases differing in the addition amount of hydrogen chloride (HCl)

As can be seen from FIG. 2, on a characteristic curve A using a source gas added with no HCl, the change in the silicon growth rate is 0.03 μm/min, i.e., there is almost no change, within the heating temperature range of 900 to 1100° C. In contrast, on characteristic curves B, C, and D using source gases added with 50%, 100%, and 200%, respectively, of HCl, the silicon growth rate is high in the high-temperature region within the heating temperature range of 950 to 1050° C. Especially on the characteristic curve D using the source gas added with 200% of HCl, the silicon growth rate is high in the high-temperature region and the change in the growth rate within the above temperature range is as large as 0.5 μm/min. In addition, on a characteristic curve E using a source gas added with 400% of HCl, the difference in the silicon growth rate between the high- and low-temperature regions is as large as 0.6 μm/min within the heating temperature range of 900 to 1100° C.

By using a source gas whose silicon growth rate has temperature dependence (temperature gradient) as above, an epitaxial layer doped with, e.g., boron is grown on a silicon wafer having an in-plane temperature distribution (the temperature is high in the peripheral portion of a wafer and low in its central portion) as described previously. During the epitaxial growth, $B_2H_6$ as a dopant increases the boron amount (doping amount) doped into the epitaxial layer as the temperature rises. Accordingly, the boron doping amount increases in the peripheral portion of the wafer and decreases in its central portion. While, as indicated by the characteristic curves B to E in FIG. 2, the silicon growth rate in the peripheral portion of the wafer at a high temperature can increase. Consequently, the increase in the boron doping amount in the high-temperature peripheral portion of the wafer can be canceled. Therefore, variations of the doping amount resulting from the in-plane temperature distribution of the wafer can be avoided. As a consequence, it is possible to grow a boron-doped silicon epitaxial layer in which the doping amount is uniform in the wafer plane, i.e., the resistance is uniform.

Note that because of the use of the source gas described above, the thickness of the epitaxial layer in the peripheral portion of the wafer in which the temperature is high, i.e., the silicon growth rate is high, tends to be larger than that in the central portion of the wafer. To avoid this variation of the thickness of the epitaxial layer in the plane of the wafer, the supply amount of the source gas to the silicon wafer having an in-plane temperature distribution is controlled when the source gas is supplied to the reaction vessel. For example, the in-plane thickness of the epitaxial layer can be made uniform by increasing the supply amount of the source gas to the low-temperature region of the wafer compared to the supply amount to the high-temperature region. More specifically, the silicon wafer 14 is placed on the annular support piece 9 in the reaction vessel 2 of the growth apparatus shown in FIG. 1, and the wafer 14 is heated to 900 to 1100° C. While the wafer 14 is rotated at a fixed speed by the rotation of the cylindrical support shaft 6, the flow rate of the source gas supplied toward the wafer 14 from the gas inlet 1 in the upper portion of the reaction vessel 2 is increased. Consequently, the supply amount of the source gas increases in the central portion of the wafer 14. Therefore, the growth rate (deposition rate) of silicon in the central portion of the wafer 14 can be made higher than that in the peripheral portion of the wafer 14. The result is that the increase of the layer thickness in the high-temperature peripheral portion of the wafer, being due to the use of the source gas which is added with HCl and the silicon growth rate of which has temperature dependence (gradient), can be canceled by controlling the supply form of the source gas. This allows the growth of an epitaxial layer having a uniform thickness in the plane of the wafer.

Accordingly, in the present invention a doped silicon epitaxial layer having a uniform resistance in a plane and a uniform film thickness in a plane, which is obtained by controlling the supply form of a source gas, can be grown on the surface of a wafer.

Also, surface roughness and particles can be reduced by supplying a source gas having a composition containing silane, 5 to 600 vol % of HCl added to the silane, and a dopant consisting of a boron or phosphorus compound to a silicon wafer heated to 900 to 1100° C. In particular, particles can be reduced because the decomposition of silane in the gas phase can be suppressed by the addition of HCl to the source gas. As a result, a doped-silicon epitaxial layer with a good surface shape and a high film quality can be grown.

In the description of the epitaxial growth method according to the present invention, the epitaxial growth apparatus in which the support mechanism offset-heats a silicon wafer as shown in FIG. 1 is used. However, it is also possible to use an epitaxial growth apparatus including a support mechanism which supports the entire back surface of a silicon wafer. In this epitaxial growth apparatus, a temperature distribution of 2 to 50° C. similarly takes place in the plane of a wafer.

Preferred examples of the present invention will be described in detail below with reference to the epitaxial growth apparatus shown in FIG. 1.

EXAMPLE 1

First, a silicon wafer 14 having 200 mm in diameter was placed on the annular support piece 9 in the reaction vessel 2. By activating the vacuum pump (not shown), a gas in the chamber surrounded by the reaction vessel 2 and the base plate 3 was exhausted through the exhaust port 4 and the exhaust pipe 5 to set a predetermined vacuum degree. Subsequently, the wafer 14 positioned above the disk-like heater 11 was heated by heating the heater 11. Since the wafer 14 was offset-heated by the annular support piece 9 on which the wafer 14 was placed, the central portion and the peripheral portion (outer circumference) of the wafer 14 were heated to 981° C. and 989° C., respectively. This offset heating gave the wafer 14 an in-plane temperature distribution of 8° C.

Subsequently, while the vacuum pump kept exhausting and the cylindrical support shaft 6 was rotated at a speed of 2000 rpm, a source gas containing silane, diborane, HCl, and hydrogen (a carrier gas) was supplied under the conditions shown in Table 1 below from the gas inlet 1 of the reaction vessel 2. At a vacuum degree of 50 torr, a boron-doped silicon epitaxial layer was grown on the surface of the wafer 14.

EXAMPLES 2–5

Comparative Examples 1–3, & Reference Example 1

Boron-doped silicon epitaxial layers were grown on the surfaces of silicon wafers following the same procedure as in Example 1 except that the silicon wafers were offset-heated at a central temperature of 981° C. and source gases having compositions shown in Table 1 below were used.

A resistance variation in the plane of the boron-doped epitaxial layer grown on the wafer surface in each of Examples 1 to 5, Comparative Examples 1 to 3, and Reference Example 1 was measured. This resistance variation was calculated by [(maximum resistance−minimum resistance)]/(maximum resistance+minimum resistance)]×100(%).

Also, a thickness variation in the plane of the boron-doped epitaxial layer grown on the wafer surface in each of Examples 1 to 5, Comparative Examples 1 to 3, and Reference Example 1 was measured. This thickness variation was calculated by [(maximum thickness−minimum thickness)/(maximum thickness+minimum thickness)]×100 (%).

Additionally, by using Surfscan 6200 (tradename) manufactured by Tencor Instruments Co, Ltd., the number of particles (diameter 0.135 to 0.2 µm) and a haze concentration in the plane of the boron-doped epitaxial layer grown on the wafer surface in each of Examples 1 to 5, Comparative Examples 1 to 3, and Reference Example 1 were measured.

The resistance variation, the thickness variation, the particle amount, and the haze concentration thus measured are also described in Table 1 below.

TABLE 1

| | Example 1 | Comparative Example 1 | Example 2 | Example 3 | Comparative Example 2 | Example 4 | Reference Example 1 | Example 5 | Comparative Example 3 |
|---|---|---|---|---|---|---|---|---|---|
| In-plane temperature difference of wafer (°C.) | 8 | 8 | 15 | 20 | 20 | 8 | 8 | 8 | 8 |
| Flow rate of SiH$_4$ (1/min) | 0.3 | 0.3 | 0.3 | 0.3 | 0.3 | 0.15 | 0.3 | 0.3 | 0.3 |
| Flow rate of HCl (1/min) | 0.15 | 0.012 | 0.15 | 0.6 | 0 | 0.15 | 0.15 | 1.2 | 2.4 |
| Flow rate of H$_2$ containing 0.1 ppm of B$_2$H$_6$ (1/min) | 0.01 | 0.01 | 0.01 | 0.01 | 0.01 | 0.01 | 0.01 | 0.01 | 0.01 |
| flow rate of H$_2$ (carrier) (1/min) | 50 | 50 | 50 | 80 | 80 | 50 | 40 | 50 | 50 |
| HCl/SiH$_4$ (%) | 50 | 4 | 50 | 200 | 0 | 100 | 50 | 400 | 800 |
| Resistance variation of epitaxial layer (%) | 1.2 | 8.9 | 2.8 | 2.2 | 24.7 | 1.0 | 1.1 | 1.3 | No layer was grown |
| Thickness variation of epitaxial layer (%) | 0.4 | 0.6 | 1.2 | 0.8 | 1.6 | 0.6 | 2.6 | 1.0 | No layer was grown |
| Particle amount (number) | 213 | 378 | 220 | 32 | 415 | 123 | 224 | 30 | 26 |
| Haze concentration (ppm) | 2.70 | 4.21 | 2.65 | 1.38 | 4.72 | 0.98 | 2.72 | 1.28 | 12.5 |

As is evident from Table 1, when a boron-doped silicon epitaxial layer was grown on the surface of a wafer heated to 900 to 1100° C. and having an in-plane temperature distribution of 2 to 50° C. by supplying a source gas at a vacuum degree of 10 to 200 torr, it was possible to obtain a uniform resistance and a uniform thickness in the plane of the epitaxial layer and reduce the particle amount and the haze concentration in each of the growth methods of Examples 1 to 5 in each of which a gas having a composition containing silane, 5 to 600 vol % of HCl added to the silane, and diborane was used as the source gas, compared to Comparative Examples 1 to 3 each using a source gas not added with HCl or a source gas whose HCl amount fell outside the range of 5 to 600 vol %.

Also, in the growth method of Reference Example 1 using a source gas whose flow rate of hydrogen as a carrier gas was lower than that in Example 1, it was not possible to supply an enough amount of the source gas to the central portion of the wafer where the heating temperature was low. Consequently, the thickness variation in the plane of the epitaxial layer was larger than that in Example 1.

EXAMPLE 6

First, a silicon wafer 14 having 200 mm in diameter was placed on the annular support piece 9 in the reaction vessel 2. By activating the vacuum pump (not shown), a gas in the chamber surrounded by the reaction vessel 2 and the base plate 3 was exhausted through the exhaust port 4 and the exhaust pipe 5 to set a predetermined vacuum degree. Subsequently, the wafer 14 positioned above the disk-like heater 11 was heated to 1000° C. by heating the heater 11. The temperature difference (in-plane temperature distribution) between the central portion and the peripheral portion (outer circumference) was 8° C.

Subsequently, while the vacuum pump kept exhausting and the cylindrical support shaft 6 was rotated at a speed of 2000 rpm, 0.3 l/min of silane, 0.01 l/min of hydrogen containing 0.01 ppm of diborane, 50 l/min of hydrogen (a carrier), and a desired amount of HCl were supplied as a source gas from the gas inlet 1 of the reaction vessel 2. At a vacuum degree of 50 torr, a boron-doped silicon epitaxial layer was grown on the surface of the wafer 14. During the epitaxial growth, the flow rate of HCl was so adjusted that the addition amounts of HCl were 0%, 100%, 200%, 300%, and 400% with respect to silane.

The number of particles (diameter 0.135 to 0.2 μm) and the haze amount in the plane of the boron-doped silicon epitaxial layer grown on the wafer surface were measured. The results are shown in FIGS. 3 and 4.

Figure 3:
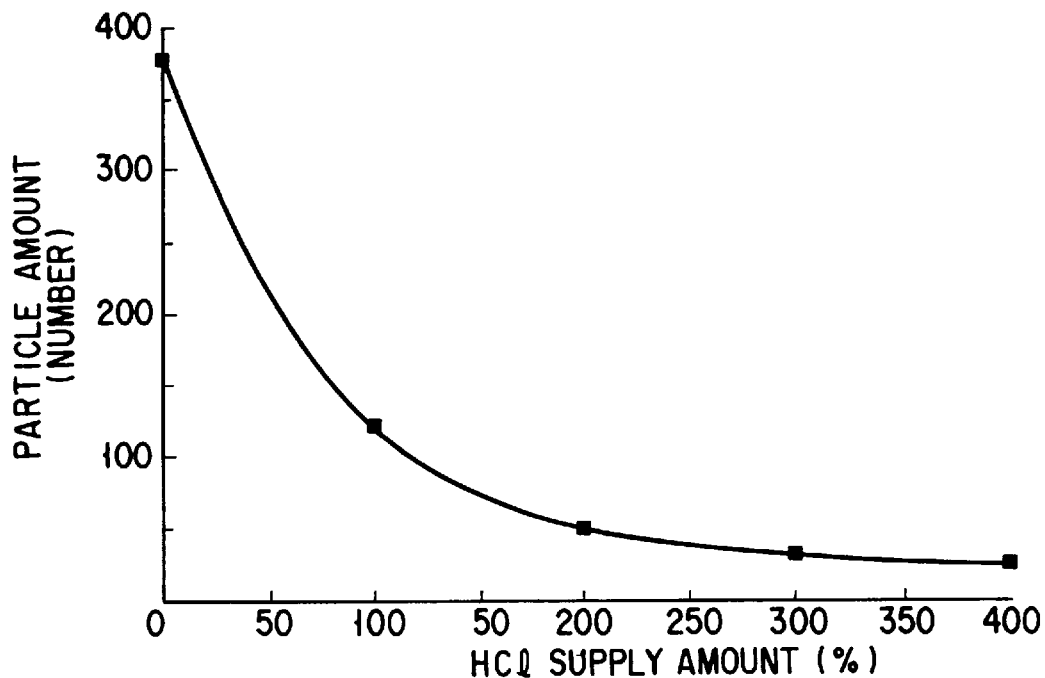
FIG. 3 is a graph showing the relationship between the supply amount of hydrogen chloride (HCl) in the source gas and the particle amount in the grown epitaxial layer.
Figure 4:
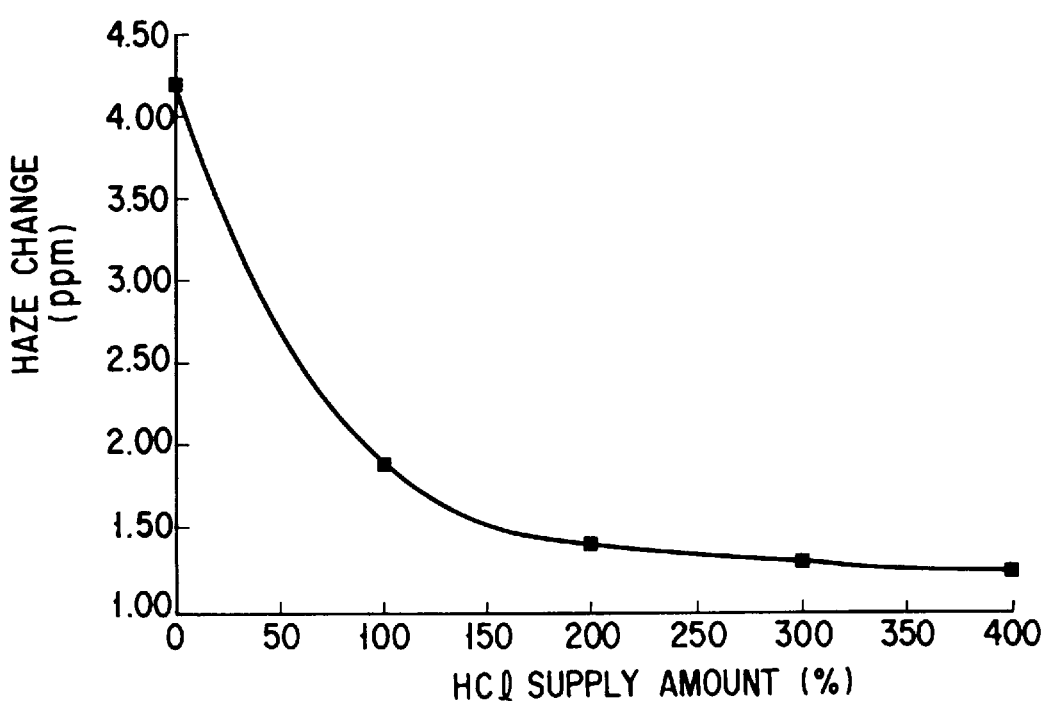
FIG. 4 is a graph showing the relationship between the supply amount of hydrogen chloride (HCl) in the source gas and the haze concentration in the grown epitaxial layer.

As can be seen from FIGS. 3 and 4, the particle amount and the haze concentration can be decreased by the use of the source gas containing silane, 5 to 600 vol % of HCl added to the silane, diborane (a dopant), and a carrier gas.

Note that n-type-impurity-doped epitaxial layers having characteristics analogous to those in Examples 1 to 6 could be grown on silicon wafers even when phosphine as a phosphorus compound was used as a dopant instead of diborane used in Examples 1 to 6.

As has been described above, the present invention can provide an epitaxial growth method capable of decreasing variations of the resistance of an epitaxial layer resulting from an in-plane temperature distribution of a silicon wafer and also capable of reducing particles and haze. Also, when epitaxial growth is performed the supply amount of the source gas is so controlled that the amount supplied to a low-temperature region of the wafer is larger than the amount supplied to the high-temperature region of the wafer. Consequently, an epitaxial layer having a uniform thickness in the plane of the film can be grown.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An epitaxial growth method of growing a boron- or phosphorus-doped silicon epitaxial layer on a surface of a silicon wafer with an in-plane temperature distribution of 2 to 50° C., comprising the steps of:
    arranging the silicon wafer in a reaction vessel;
    supplying into said reaction vessel a source gas containing (a) silane, (b) 5 to 600 vol % of hydrogen chloride added to the silane, and (c) a dopant consisting of a boron compound or a phosphorus compound; and
    growing a boron- or phosphorus-doped silicon epitaxial layer on a surface of the wafer by setting a vacuum degree of 10 to 200 torr in said reaction vessel and heating the wafer to 900 to 1100° C.

2. A method according to claim 1, wherein the silicon wafer is supported and offset-heated by an annular support member whose bottom peripheral portion is heated in said reaction vessel.

3. A method according to claim 1, wherein the silicon wafer is rotated at a speed of 500 to 2500 rpm during the epitaxial growth.

4. A method according to claim 1, wherein 50 to 300 vol % of the hydrogen chloride are added to the silane.

5. A method according to claim 1, wherein 100 to 300 vol % of the hydrogen chloride are added to the silane.

6. A method according to claim 1, wherein the boron compound is diborane.

7. A method according to claim 1, wherein the phosphorus compound is phosphine.

8. A method according to claim 1, wherein an addition amount of the dopant is $4 \times 10^{-9}$ to $2 \times 10^{-6}$ times an amount of the silane as a volume ratio.

9. A method according to claim 1, wherein the source gas further contains hydrogen.

10. A method according to claim 9, wherein an addition amount of the hydrogen is 130 to 300 times an amount of the silane as a volume ratio.

11. A method according to claim 1, wherein the source gas is so controlled that a supply amount to a low-temperature region of the wafer is larger than a supply amount to a high-temperature region.

* * * * *

UNITED STATES PATENT AND TRADEMARK OFFICE
CERTIFICATE OF CORRECTION

PATENT NO. : 5,904,769
DATED : May 18, 1999
INVENTOR(S) : T. Ohashi et al.

It is certified that error appears in the above-identified patent and that said Letters Patent is hereby corrected as shown below:

Title Page:         LINE

Item:

[56]        Other Publs.,        After "Effect of" delete "of"
col. 2       item 1,
           second line

[56]        Other Publs.,        "D;D;" should read --D.D;--
col. 2       item 1,
           third line Signed and Sealed this Fourth Day of January, 2000

Attest:

Attesting Officer          *Acting Commissioner of Patents and Trademarks*